United States Patent
Yu et al.

(10) Patent No.: US 8,278,679 B2
(45) Date of Patent: Oct. 2, 2012

(54) LED DEVICE WITH EMBEDDED TOP ELECTRODE

(75) Inventors: Chen-Hua Yu, Hsin-Chu (TW);
Ding-Yuan Chen, Taichung (TW);
Wen-Chih Chiou, Miaoli (TW)

(73) Assignee: TSMC Solid State Lighting Ltd., Hsin-Chu (TW)

( * ) Notice: Subject to any disclaimer, the term of this patent is extended or adjusted under 35 U.S.C. 154(b) by 1045 days.

(21) Appl. No.: 12/235,269

(22) Filed: Sep. 22, 2008

(65) Prior Publication Data

US 2009/0267105 A1 Oct. 29, 2009

Related U.S. Application Data

(60) Provisional application No. 61/048,754, filed on Apr. 29, 2008.

(51) Int. Cl.
*H01L 33/00* (2010.01)
(52) U.S. Cl. ................ 257/99; 257/E33.062
(58) Field of Classification Search ............ 257/79–103, 257/E33.062, E33.065
See application file for complete search history.

(56) References Cited

U.S. PATENT DOCUMENTS

| 5,703,436 | A | 12/1997 | Forrest et al. |
| 5,917,202 | A * | 6/1999 | Haitz et al. ............ 257/98 |
| 6,264,805 | B1 | 7/2001 | Forrest et al. |
| 7,714,339 | B2 * | 5/2010 | Liu ....................... 257/95 |
| 2002/0063256 | A1 * | 5/2002 | Lin ........................ 257/79 |
| 2004/0223528 | A1 | 11/2004 | Wortman et al. |
| 2005/0145864 | A1 * | 7/2005 | Sugiyama et al. ........ 257/95 |
| 2006/0138445 | A1 | 6/2006 | Zhao et al. |
| 2008/0096297 | A1 | 4/2008 | Schiaffino et al. |

OTHER PUBLICATIONS

Schwegler, V., et al., "Spatially Resolved Electroluminescence of InGaN-MQW-LEDs," 1999 Materials Reseach Society Fall Meeting, Jul. 1, 2000, pp. w1.6.1-w1.6.5.

* cited by examiner

*Primary Examiner* — Tucker Wright
(74) *Attorney, Agent, or Firm* — Haynes and Boone, LLP

(57) ABSTRACT

An LED device and a method of manufacturing, including an embedded top electrode, are presented. The LED device includes an LED structure and a top electrode. The LED structure includes layers disposed on a substrate, including an active light-emitting region. A top layer of the LED structure is a top contact layer. The top electrode is embedded into the top contact layer, wherein the top electrode electrically contacts the top contact layer.

20 Claims, 10 Drawing Sheets

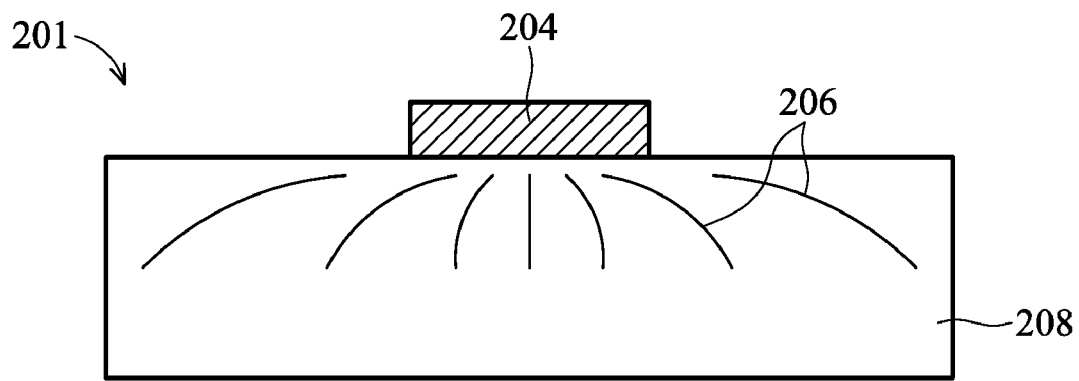
FIG. 2A (PRIOR ART)
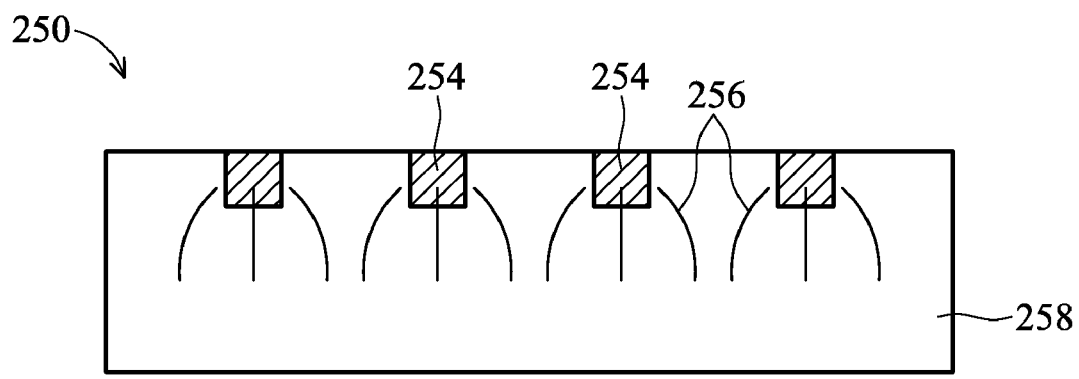
FIG. 2B (Illustrative Embodiment)

LED DEVICE WITH EMBEDDED TOP ELECTRODE

This application claims priority to U.S. Provisional Application No. 61/048,754, filed on Apr. 29, 2008, entitled "Embedded Electrode for Large Contact and Emitting Area," which application is hereby incorporated herein by reference.

TECHNICAL FIELD

The present invention relates generally to light emitting diodes (LEDs), and more particularly to an LED electrode configured for enhanced current spreading while allowing increased light transmission from the LED.

BACKGROUND

A light-emitting diode is a semiconductor diode that emits light when electrically biased in the forward direction of a p-n junction. A typical vertical LED structure may include an n-electrode, a substrate, an n-type layer, a multiple or single quantum well region, a p-type layer, and a p-electrode.

A challenge for LED device design is contacting the emission face of the LED. Metal structures typically used as electrodes may obstruct the transmission of light emitted from the active light-emitting region of the LED. Further, the low conductivity of p-GaN and its alloys may necessitate lateral current spreading schemes. In general, the greater the current that is flowing through the LED, the brighter the light emitted. However, current spreading across the active light-emitting region must be carefully controlled. Too much current or highly localized current may cause damage to the active light-emitting material. In contrast, not enough current, uniformly reaching the LED material, may lead to inefficiencies in light emission.

Several methods have been implemented to contact the emission face of the LED. Some methods involve the use of a transparent conductive material such as, for example, indium tin oxide. Other methods may use metal contacts of various types including very thin nickel-gold films to contact the LED emitting face.

Turning to prior art FIG. 7, an example of prior art LED 702 uses an indium tin oxide (ITO) coating 712 on top of top contact layer 714. A metal pad 710 is attached on the top face 716 of ITO coating 712 thus forming an electrode to top contact layer 714. A disadvantage of this method is that metal pad 710 blocks a percentage of the emitted light. Further, ITO coating 712 has been known to degrade over time for UV LEDs.

Another example of a prior art LED 704 comprises an ITO coating 722 disposed on top contact layer 724 and an ITO pad 720 affixed to ITO coating 722. This top electrode method allows for better transmission of the light. However, bonding ITO pad 720 to ITO coating 722 may be difficult and may lead to early failure of the device. Further, example prior art LED 704 may have the disadvantages discussed above.

Yet another example of a prior art LED 706 comprises a thin film of Ni/Au 732 disposed on top contact layer 734, with a metal pad 730 affixed to the thin film of Ni/Au 732. The Ni/Au film 732 may block some light transmission, degrading LED efficiency in addition to the obstruction of light by metal pad 730.

What is needed then, is a new structure and method of contacting LEDs that overcomes the above described shortcomings in the prior art.

SUMMARY OF THE INVENTION

These and other problems are generally solved or circumvented, and technical advantages are generally achieved by providing an LED electrode configured for enhanced current spreading while allowing increased light transmission from the LED.

In accordance with an illustrative embodiment of the present invention, an LED device and a method of manufacturing, including an embedded top electrode, are presented. The LED device includes an LED structure and a top electrode. The LED structure includes layers disposed on a substrate including an active light-emitting region. A top layer of the LED structure comprises a top contact layer. The top electrode is embedded into the top contact layer, wherein the top electrode electrically contacts the top contact layer.

Advantages of preferred embodiments of the present invention include providing an efficient current spreading electrode to an active light-emitting region while increasing light transmission through the emitting face of an LED.

The foregoing has outlined rather broadly the features and technical advantages of an illustrative embodiment in order that the detailed description of the invention that follows may be better understood. Additional features and advantages of an illustrative embodiment will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the illustrative embodiments as set forth in the appended claims.

BRIEF DESCRIPTION OF THE DRAWINGS

For a more complete understanding of the illustrative embodiments, and the advantages thereof, reference is now made to the following descriptions taken in conjunction with the accompanying drawings, in which:

FIGS. 2A and 2B show current densities within the bulk contrasted between prior art LED 201 (FIG. 2A), and LED 250 (FIG. 2B), which is in accordance with an illustrative embodiment;

Corresponding numerals and symbols in the different figures generally refer to corresponding parts unless otherwise indicated. The figures are drawn to clearly illustrate the relevant aspects of the preferred embodiments and are not necessarily drawn to scale.

Detailed Description Of Illustrative Embodiments

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the invention, and do not limit the scope of the invention. For example, the illustrative embodiments discuss vertical LEDs; however lateral LEDs are within the scope of the embodiments.

An LED device is presented, which combines an electrode configured for enhanced current spreading while allowing increased light transmission from the LED. The LED device comprises embedded top electrodes within the light emitting face of the LED. Further, the embedded top electrodes may be interconnected with a web of conductive material.

Note that although the term layer is used throughout the specification and in the claims, the resulting features formed using the layer should not be interpreted together as only a continuous or uninterrupted feature. As will be clear from reading the specification, the layer may be separated into distinct and isolated layers and/or features, some, or all of which comprise portions of the substrate. In other embodiments, a layer may refer to a continuous feature having a uniform appearance; yet, it may include layers and/or regions having different physical or chemical properties.

Figure 1:
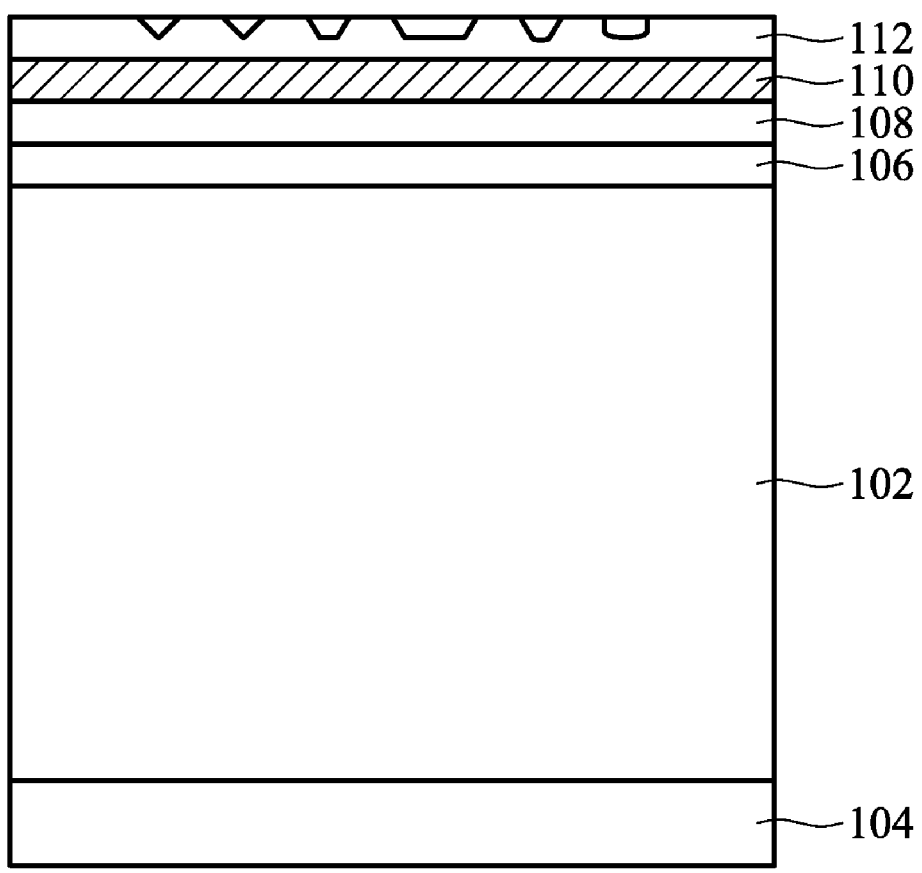
FIG. 1 shows a cross-sectional view of an LED structure with embedded top electrodes in accordance with an illustrative embodiment.

Turning to FIG. 1, a cross-sectional view of an illustrative embodiment of the present invention is shown. LED 100 comprises bulk layer 102. Bulk layer 102 is contacted on a first side by bottom electrode 104. Bulk layer 102 may comprise sapphire, GaN, Si, Ge, SiC, SiGe, ZnO, ZnS, ZnSe, GaP or GaAs, for example. Bottom electrode 104 may be formed from a conductive material such as, for example, Al, Ti/Al, Ti/Au, other metals, metal alloys, a non-metal conductive material, or the like. Buffer layer 106 may be formed on the second side of bulk layer 102. Buffer layer 106 may be formed by an epitaxial process.

An epitaxial film is an ordered crystalline growth layer formed on a monocrystalline substrate or layer. Epitaxial films may be grown from gaseous or liquid precursors. Because the substrate or exposed layer acts as a seed crystal, the epitaxially grown film takes on a lattice structure and orientation of the substrate. Heteroepitaxy is the process of depositing an epitaxial layer on a substrate of a different composition.

Buffer layer 106 may comprise a Group III-nitride layer such as AlN, TiN, or other metal nitride and may be in the thickness range of about 200-400 Å. AlN, for example, has a hexagonal crystal structure and a large band gap and may be disposed by a molecular-beam epitaxy (MBE), metal organic chemical vapor deposition (MOCVD), Hydride Vapor Phase Epitaxy (HVPE), liquid phase epitaxy (LPE) process, or the like.

In MBE, a source material is heated to produce an evaporated beam of particles. The beam of particles are deposited in a high vacuum ($10^{-8}$ Pa), where the beam of particles condense into a layer. In an MOCVD process, the formation of the epitaxial layer occurs by final pyrolisis of the constituent chemicals at the substrate surface. In contrast to MBE, the growth of crystals in an MOCVD process is by chemical reaction and not physical deposition. HVPE is an epitaxial growth technique, which may use carrier gasses such as ammonia, hydrogen and various chlorides. LPE is a method to grow crystal layers from the melt on solid substrates.

In an embodiment, buffer layer 106 may be reflective. The material itself may be reflective, or a distributed Bragg reflector (DBR) may be included in addition to, or instead of, buffer layer 106. A distributed Bragg reflector may be comprised of alternating layers of materials with differing refractive indices, or the like. In the case of a reflective buffer layer 106, LED 100 is a top emitting LED and the power output from the topside may be greater than an illustrative embodiment in which buffer layer 106 is non-reflective.

Bottom contact epitaxial layer 108 is disposed on buffer layer 106. Bottom contact epitaxial layer 108 may be in the range of about 1 to 4 µm thick. An example material for bottom contact epitaxial layer 108 is GaN:Si or GaN:Mg disposed by a MOCVD, MBE, HVPE, or LPE process.

Active layer 110 is disposed on the bottom contact epitaxial layer 108. Active layer 110 may comprise multiple quantum wells (MQW). MQW structures in active layer 110 may comprise $Al_xIn_yGa_{(1-x-y)}N$, where $0<=x<=1$), for example. Active layer 110 may comprise any number of quantum wells, 3 to 5 quantum wells for example, each preferably about 30 to about 100 Å thick. MQWs in active layer 110 may be disposed in an epitaxial reactor. Top contact layer 112 is disposed or grown on active layer 110. Top contact layer 112 may be grown in an epitaxial reactor to about 0.3 µm thick and comprise GaN:Mg, GaN:Si, or the like.

Top electrodes are embedded into top contact layer 112, meaning more than one surface of top electrodes 114 electrically and physically contact top contact layer 112 and that top electrodes 114 are formed within top contact layer 112. Top electrodes 114 are discreet, in other words, embedded top electrodes do not form a continuous layer of conductive materials. Rather embedded top electrodes are individual and discontinuous, connected only by a conductive web (not shown). All, except one surface, of top electrodes 114 are connected by the conductive web. Top electrodes 114 may be comprised of any conductive material, such as metals and metal alloys, for example, nickel gold alloy may be used. Further, transparent conductive material such as ITO or ZnO may be used. Indium tin oxide (ITO, or tin-doped indium oxide) may preferably be a mixture of indium (III) oxide ($In_2O_3$) and tin (IV) oxide ($SnO_2$), and may be 90% $In_2O_3$, 10% $SnO_2$ by weight. ITO is transparent and colorless in thin layers. Indium tin oxide's main advantageous feature is the combination of electrical conductivity and optical transparency.

In the embodiment shown, top electrodes 114 have multiple shapes (see FIG. 4 for further examples of embedded top electrode shapes). Embedded top electrodes 114 preferably are of similar shape across an LED. However, differing shapes may be used in the same device.

The three-dimensional aspect of the electrodes, in other words, the feature of embedding the electrodes into top contact layer 112, increases the contact area between top contact layer 112 and top electrodes 114, by providing contact between the sides of top electrodes 114 and top contact layer 112. The surface area of top electrode 114 is comprised of a contacting surface area and a remaining surface area. The contacting surface area is the area of top electrode 114 that is in electrical and physical contact with top contact layer 112. The contacting surface area is larger than the remaining surface area. Preferably, the contacting surface area is at least about 1.5 times the size of the remaining surface area. This additional contact area aids in more uniformly spreading current in top contact layer 112.

Turning now to FIGS. 2A and 2B, current densities within the bulk are contrasted between prior art LED 201 (FIG. 2A) and LED 250 (FIG. 2B), which is in accordance with an illustrative embodiment. FIG. 2A is a prior art depiction of the disadvantages of the current distribution in a known method of contacting an LED, such as LED 201. Electrode 204 is on top of LED structure 208. The current density lines 206 represent the current density in the LED 201. Note that the current density is not dispersed uniformly in LED structure 208.

In contrast, FIG. 2B depicts the current distribution advantage of an illustrative embodiment. LED 250 comprises LED structure 258 and top electrodes 254. Note the current density lines 256. The current density in LED 250 is more uniformly distributed than the current density in LED 201. The increased contact area extending deep into the top contact layer provides an enhanced, uniformly injected current into LED 250, while limiting the light blocking tendencies of top contacts. The top electrode 254 has an area of physical contact to LED 250, which is greater than prior art LED 201 top electrodes, which are on top of, or along the side of, the top contact layer 208. Top electrode 254 of the illustrative embodiment LED 250 allows for lateral current conduction from the sides of top electrode 254 as well as vertical conduction, therefore LED 250 receives a more uniformly injected current, making LED device 250 more efficient than LED 201.

Figure 3A:
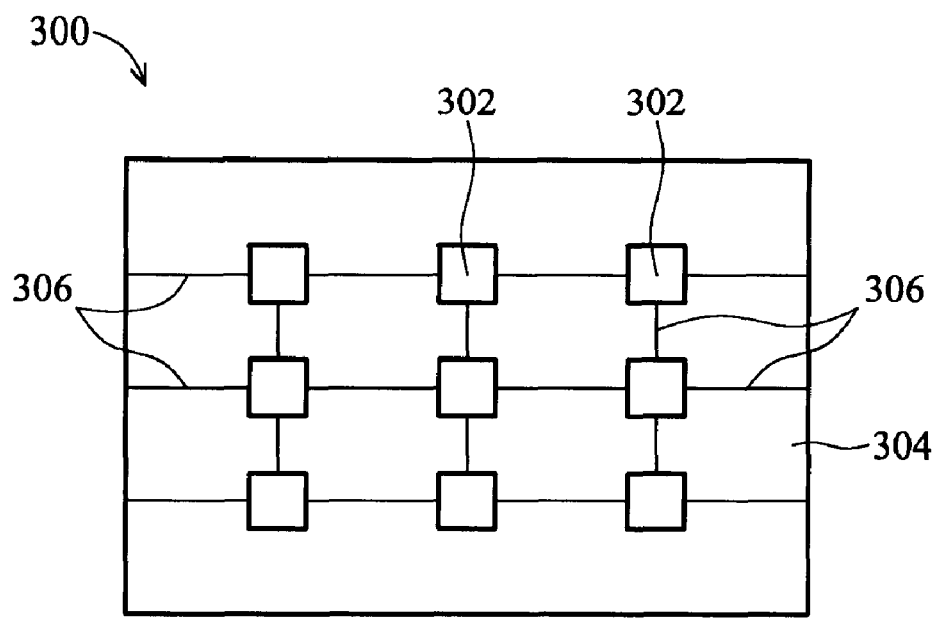
FIGS. 3A and 3B show two embodiments of embedded top electrodes with conductive webs.
Figure 3B:
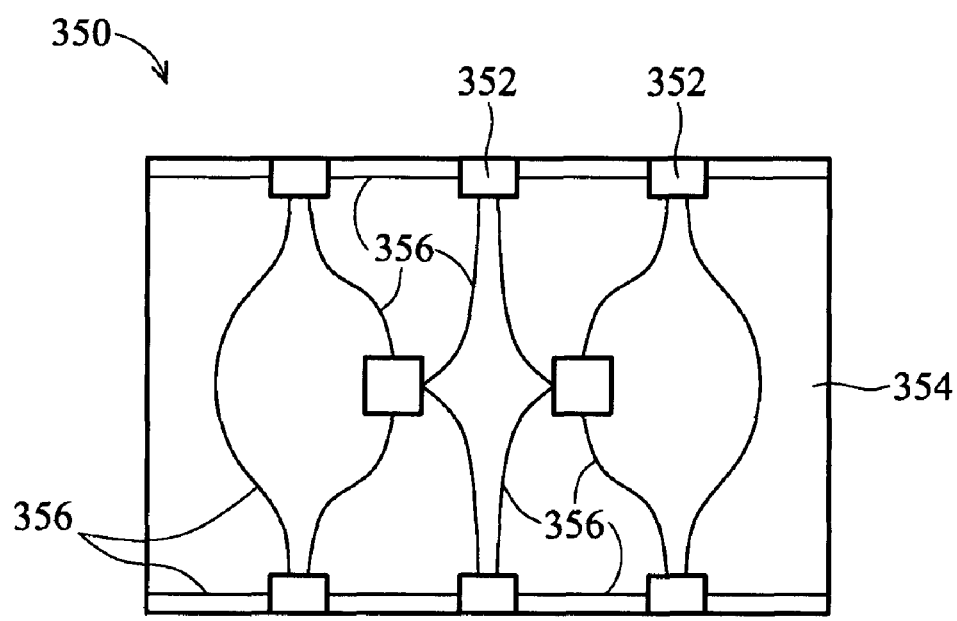
Figure 4A:
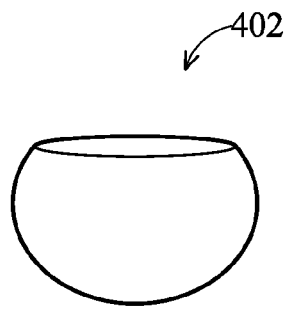
FIG. 4 shows views of example embedded top electrode shapes.
Figure 4B:
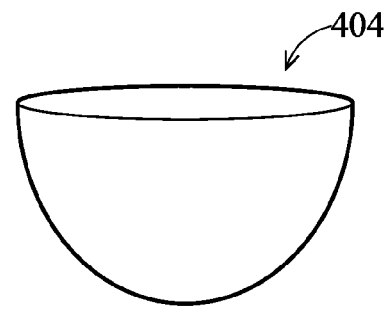
Figure 4C:
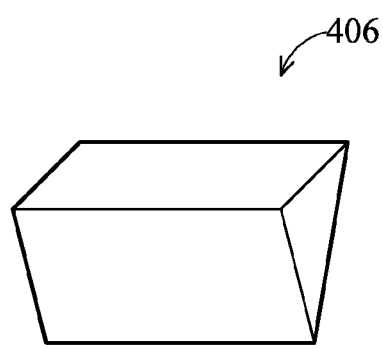
Figure 4D:
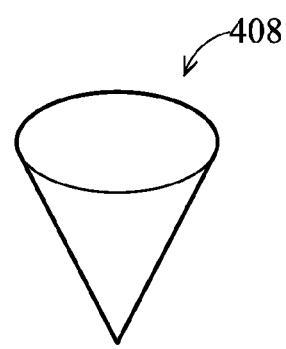
Figure 4E:
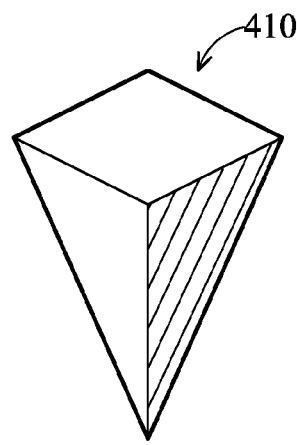
Figure 4F:
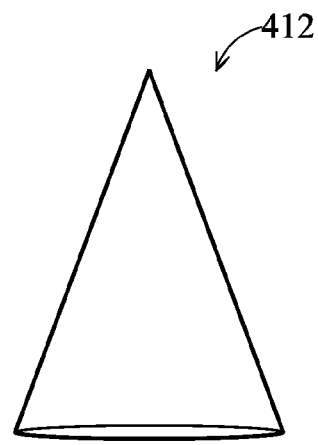

Turning to FIGS. 3A and 3B, top views of other embodiments of an LED device with top electrodes are shown, employing conductive webs, in accordance with further illustrative embodiments.

While a prior art method of a uniform layer of conductive material may provide high concentration of charge carriers, a uniform layer of conductive material may also decrease the transparency of the layer and/or make subsequent contacting problems difficult to overcome. Therefore, in the illustrative embodiments, a conductive web may be employed as follows.

LED device 300 includes a top contact layer 304, similar to top contact layer 112 in FIG. 1. Further, LED 300 comprises a substantially conductive web 306 interconnecting the embedded top electrodes 302. It is advantageous for a width of the conductive web lines to be as thin as is practical, thereby obstructing a minimum of generated light. Substantially conductive web 306 may comprise any conducting material, such as metals, metal alloys, indium tin oxide (ITO) or another suitable material, ZnO, for example, that electrically interconnects embedded top electrodes 302. LED 300 shows embedded top electrodes 302 substantially in a grid pattern with conductive web 306 uniformly spaced through out top contact layer 304. Conductive web 306 may employ the same conductive material as top electrode 302 or different conductive web 306 material than top electrode 302.

LED 350 shows a structure similar to LED 300, wherein an embodiment of conductive web 356 interconnecting embedded top electrodes 352 is not in a grid pattern. Embedded top electrodes 352 may not be in a grid pattern and conductive web 356 may not be spaced at regular intervals. Conductive web 356 is comprised preferably of a substantially transparent conductor thereby allowing maximum transmission of emitted light. However, conductive web may be comprised of any conductive material, such as metals and metal alloys, in addition to ITO or other conductive materials. The conductive web may be less than 50 nm deep. The conductive web may be patterned at the same time as the top electrodes or may be patterned in a separate patterning process. Thus, conductive web and embedded top electrodes may or may not be comprised of similar materials. Conductive web 356 is preferably a shallower thickness than top electrodes 352. For example, top electrode 352 may be between about 40 nm and about 150 nm. The different depths may be determined by the size of the photoresist opening during the etch process. Further, the area covered by a conductive web may be less than 50% of the LED light emitting surface 354.

Turning to FIG. 4, views of example top electrode shapes, 402-412, are shown. Other shapes may be used within the scope of an illustrative embodiment. The top electrodes may be an inverted pyramid shape 410, such as those shown in FIG. 1, or top electrodes may be cone shaped 408. Further, the embedded structure shape may be any shape there between. In other words, the pyramid shape may have corners that further round until the shape is conical. Further example shapes include partial spheres 402 and partial elongated spheres 404, wedge type shapes 406, inverted cone shape 412 as shown, or the like. The choice of which shape to implement may depend on LED design including such parameters as the thickness of top contact layer.

To form top electrode shapes, a first pattern layer is disposed on a top contact layer. A photoresist layer is patterned by methods known in the art, defining embedded top electrodes and/or the conductive web. The top contact layer is then etched. Different electrode shapes may be formed by photoresist patterning, isotropic etches, anisotropic etches, and combinations thereof. The etch(es) form shaped openings in the top contact epitaxial layer. A conductive layer may then be disposed, filling the openings, or partially filling the openings. The conductive layer may be a metal, a metal alloy, an indium tin oxide (ITO) layer, or the like. Thin films of ITO are most commonly deposited on surfaces by electron beam evaporation, physical vapor deposition, or a range of sputter deposition techniques. The pattern layer may then be lifted, removing the pattern layer and any undesired conductive material. Top electrode shapes may be essentially greater than 50 nm deep.

Figure 5A:
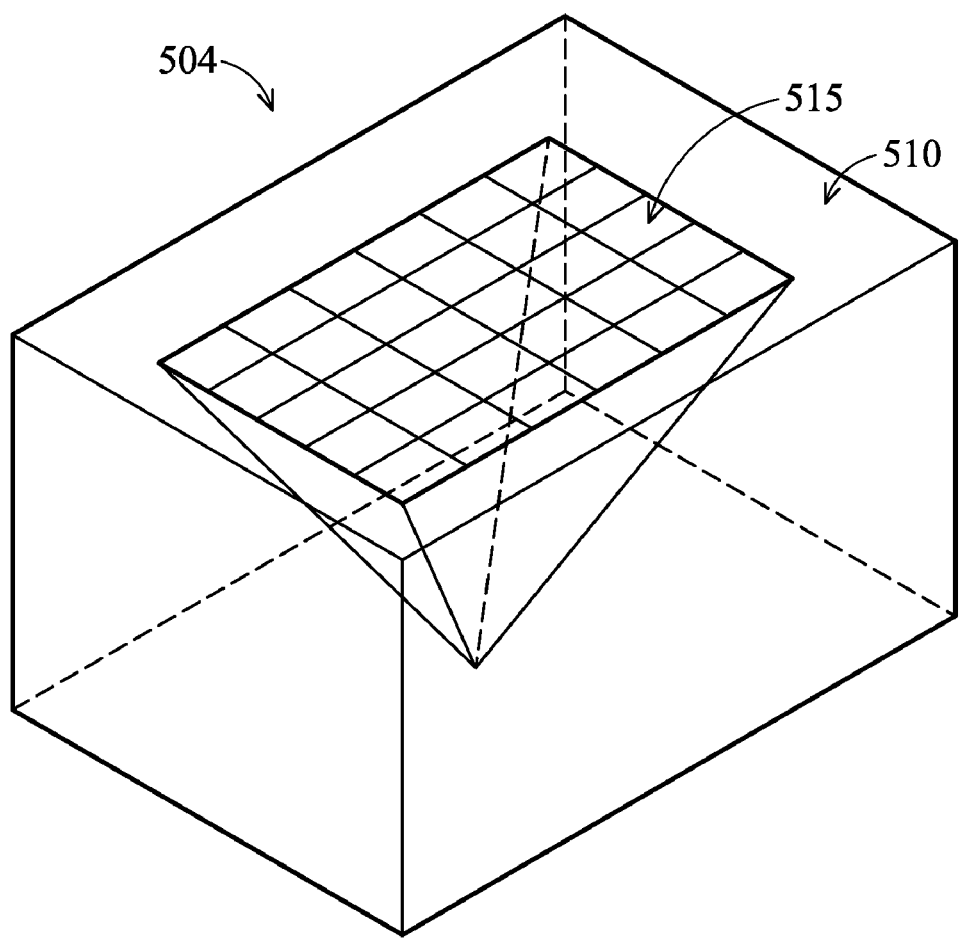
FIGS. 5A-5C show views of recessed (FIG. 5A), non-recessed (FIG. 5B) and layered (FIG. 5C) embedded top electrodes.
Figure 5B:
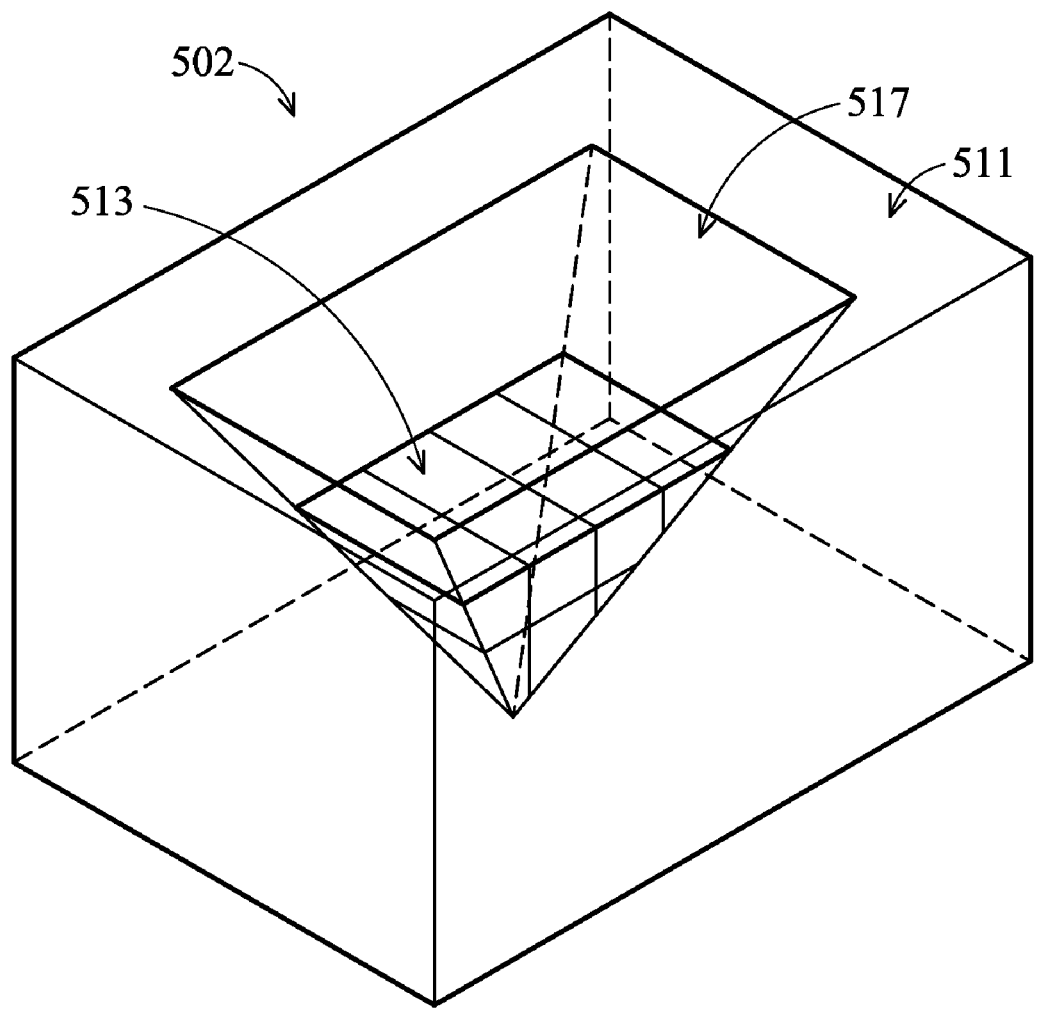
Figure 5C:
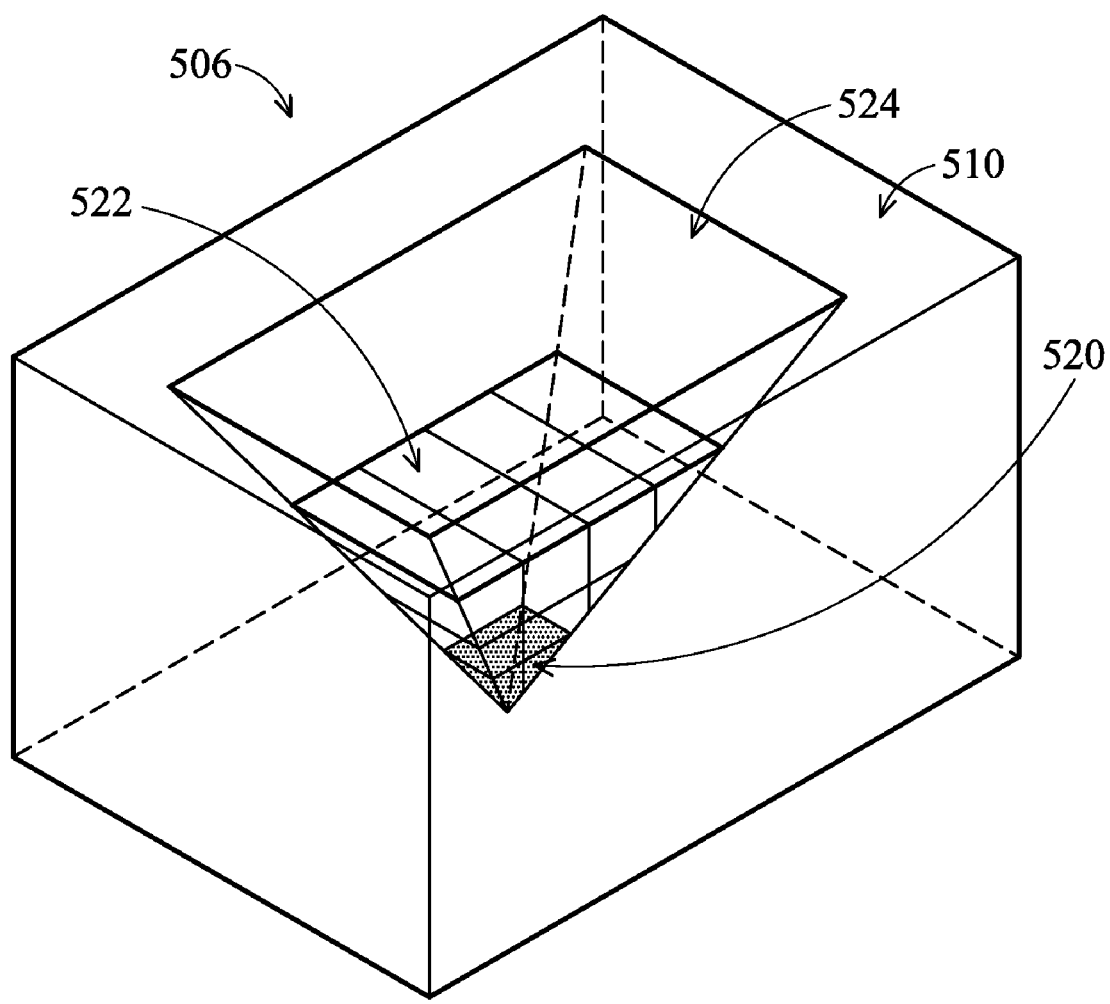

Turning to FIG. 5A-5C, views of non-recessed 504, recessed 502, and layered 506 embedded top electrodes are shown. An inverted pyramid shape is used as an example to show examples of recessed embedded top electrodes; however, any embedded shaped electrode may be non-recessed, recessed, or layered.

Turning to FIG. 5A, in non-recessed embedded top electrode 504, the electrode material 515 fills the entire electrode structure in order to be planar with the top of n-type (or p-type) top contact layer 510. Non-recessed embedded top electrodes 504 may be contacted by a conductive web, or non-recessed embedded top electrodes 504 may have electrical contact to the top of the electrode material.

Turning to FIG. 5B, recessed top electrode 502 shows electrode material 513 recessed into top contact layer 511. In other words, the transparent conductive and or conductive material electrode material 513 fills a portion of the recessed top electrode 502, but does not fill the entire structure. The top of the electrode material 513 in embedded top electrode 502 is not planar with the top of the top contact layer 511. An open portion 517 remains above recessed top electrode 502. Recessed embedded top electrode 502 may be contacted by a conductive web, such as conductive web 306 in FIG. 3, or recessed embedded top electrodes may have electrical contact to the top of the electrode material 515.

Turning next to FIG. 5C, layered embedded top electrode 506 shows non-conductive material 520 in a bottom portion of layered embedded top electrode 506, conductive material 522 filling a mid portion of layered embedded top electrode 506, and the remaining portion 524 is open. Therefore, layered embedded top electrode 506 is an example of a recessed top electrode and the conductive material 522 is not coplanar with top contact layer 510. The non-conductive material 520 in the bottom portion of layered embedded top electrode 506 may be, for example, $SiO_2$, SiN, other insulator, or the like.

An advantage of a non-conductive material 520 in the bottom portion of an embedded top electrode is the reduction or elimination of current crowding that may take place in some shapes of an embedded top contact. The tip of an inverted pyramid type top electrode, as shown in this example, may be prone to current crowding. Current crowding may then cause defects in an LED device. Layered top electrodes may be recessed or non-recessed and may be of any shape in accordance with the illustrative embodiments.

Layered embedded top electrode 506 may be contacted by a conductive web. The conductive web may be embedded into the top contact layer 510 at the depth, which contacts the mid portion of layered embedded top electrode 506, in other words the conductive material 522 of layered embedded top electrode 506.

Figure 6A:
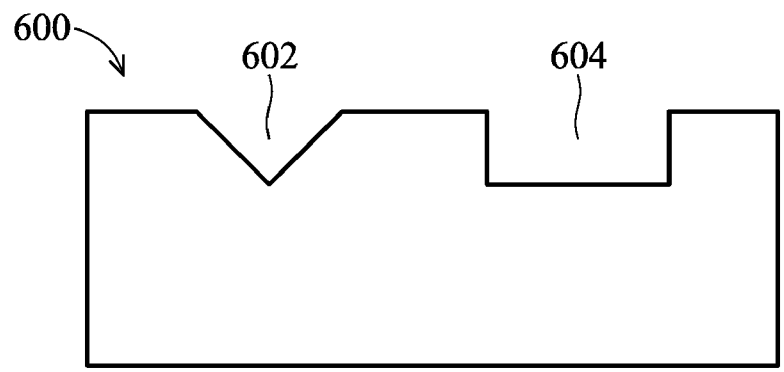
FIGS. 6A-6E show cross-sectional views of an example process flow for an embedded electrode with a dielectric layer.
Figure 6B:
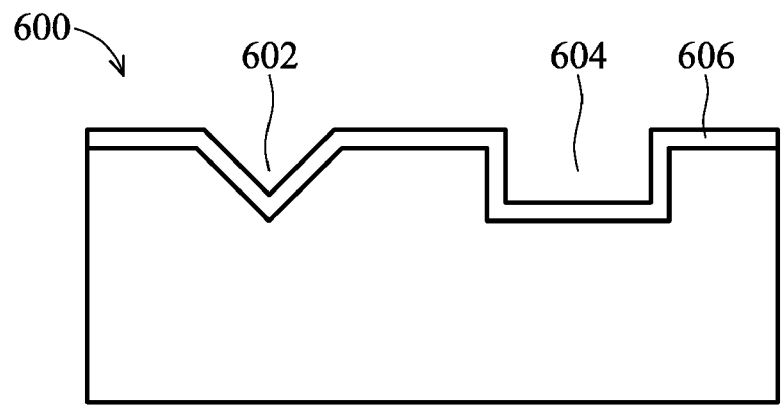

FIGS. 6A-6D show a portion of a process flow depicting a method to form a first layer of dielectric in an embedded electrode. FIG. 6A depicts an LED structure 600 following etching of the top electrodes (note top electrode opening 602 and conductive web opening 604 cross-sectional views). FIG. 6B shows LED structure 600 with dielectric layer 606 deposited. Dielectric layer 606 may be an oxide, a nitride, a low-k dielectric, combinations thereof, or the like.

Figure 6C:
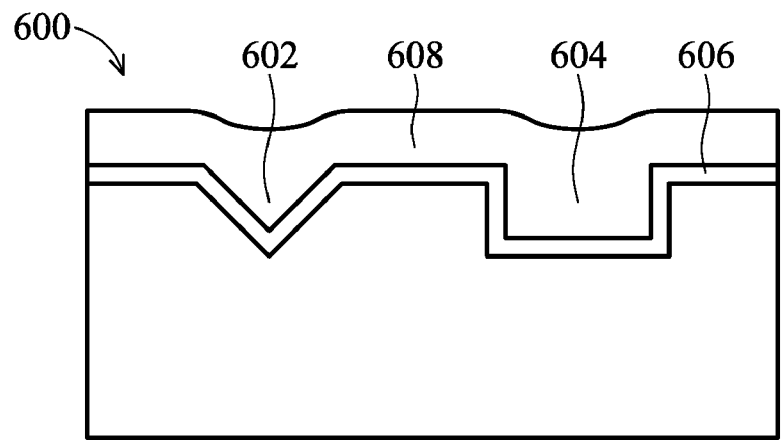
Figure 6D:
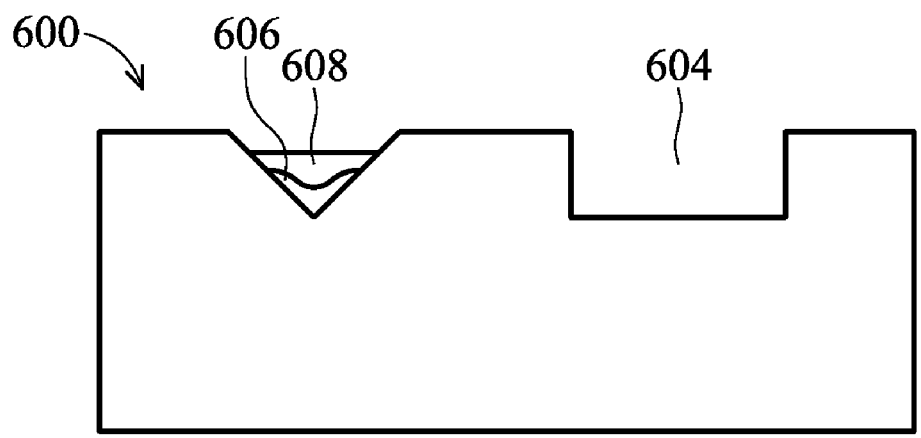

FIG. 6C shows LED structure 600 with photoresist layer 608 deposited on dielectric layer 606. Photoresist layer 608 is etched back, leaving only photoresist layer 608 protecting dielectric layer 606 in top electrode opening 602. Note that photoresist 608 is completely removed except in top electrode opening 602. The unprotected dielectric layer 606 is then etched. All of dielectric layer 606 is etched away except for the dielectric material that is protected by photoresist 608 in a bottom portion of top electrode opening 602. FIG. 6D shows the resultant cross-sectional view. The remaining photoresist is then removed leaving dielectric material in a lower portion of top electrode opening 602. A second layer of photoresist may then be deposited and patterned, leaving top electrode opening 602 and conductive web openings 604 regions open (not shown).

Figure 6E:
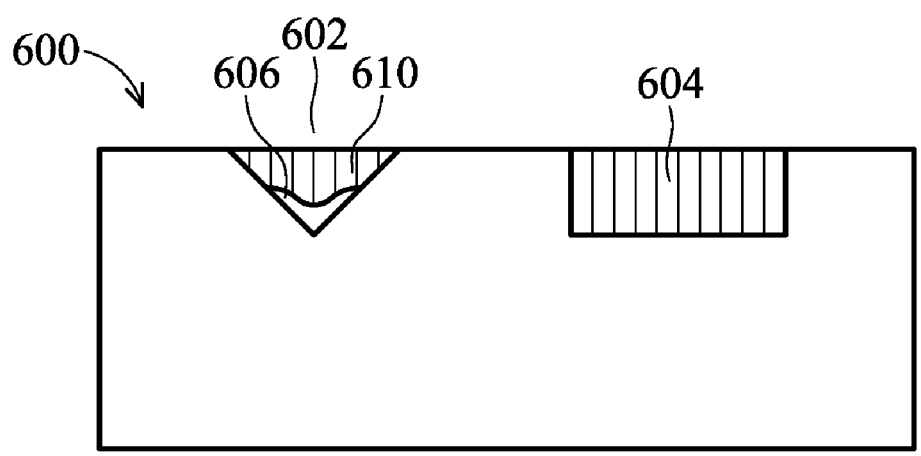
Figure 7A:
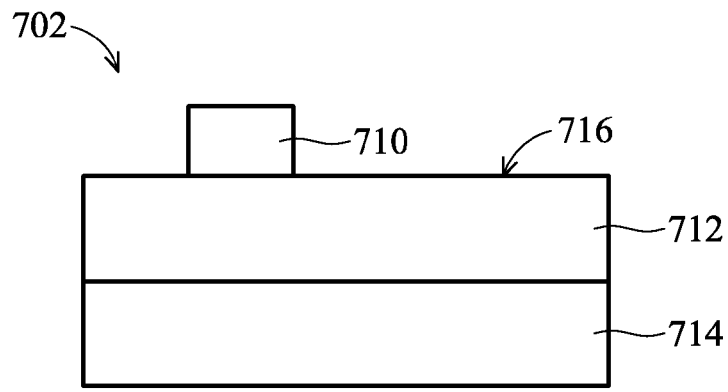
FIG. 7 illustrates cross-sectional views of prior art electrode structures.
Figure 7B:
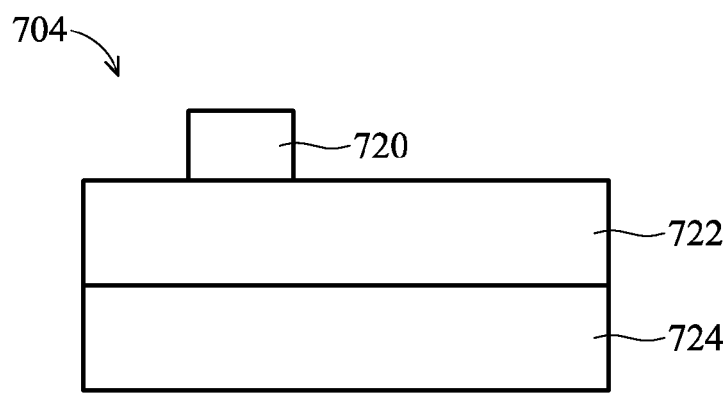
Figure 7C:
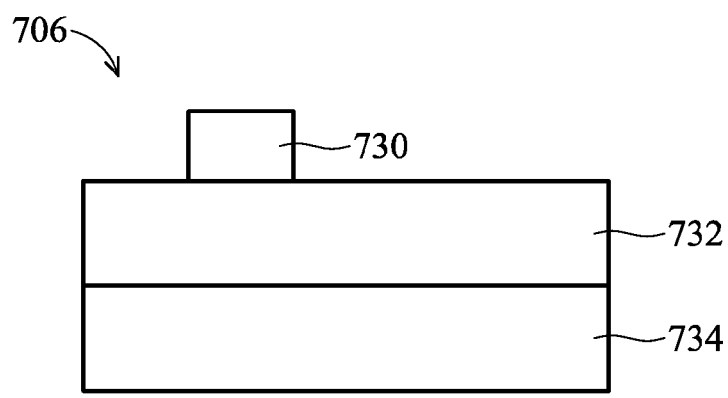

Turning to FIG. 6E a conductive material 610 may then be deposited. The second photoresist layer may then be lifted off (not shown), taking any residual conductive material from LED 600. The LED may then be planarized using a CMP process.

The scope of the illustrative embodiments includes the cases of an LED device with a p-type top contact epitaxial layer and the inverted case with n-type top contact epitaxial layer. In other words, the LED structure may be formed with the embedded top electrode comprising the n-electrode and the bottom electrode comprising the p-electrode, or the LED structure may be formed with the embedded top electrode comprising the p-electrode and the bottom electrode comprising the n-electrode. Further, the LED device may be a lateral emitting device.

Although the illustrative embodiment and its advantages have been described in detail, it should be understood that various changes, substitutions, and alterations can be made herein without departing from the spirit and scope of the invention as defined by the appended claims. For example, many of the features and functions discussed above can be implemented in software, hardware, or firmware, or a combination thereof.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A light emitting diode (LED) device comprising:
   a substrate;
   an LED structure having layers, including an active light-emitting layer, disposed on the substrate, and having a top contact epitaxial layer including a top surface; and
   a first top electrode embedded into the top contact epitaxial layer such that a top surface of the first top electrode is recessed relative to the top surface of the top contact epitaxial layer without physically contacting the top contact epitaxial layer, wherein the first top electrode electrically contacts the top contact epitaxial layer.

2. The LED device of claim 1, wherein the first top electrode comprises a metal, a metal alloy, a conductive material, or combinations thereof.

3. The LED device of claim 1 further comprising:
   a second top electrode; and
   a conductive web connecting the first top electrode and the second top electrode.

4. The LED device of claim 3, wherein the conductive web comprises a metal, a metal alloy, a conductive material, or combinations thereof.

5. The LED device of claim 3, wherein the conductive web extends less than about 50 nm into the top contact layer.

6. The LED device of claim 1, wherein the first top electrode is recessed from a top plane of the top contact epitaxial layer.

7. The LED device of claim 6 further comprising: a non-conductive layer beneath the first top electrode.

8. The LED device of claim 1, wherein the first top electrode extends greater than about 50 nm and less than about 150 nm into the top contact layer.

9. The LED device of claim 1, wherein the first top electrode has a non-conductive bottom surface.

10. A light emitting diode (LED) structure comprising:
    a top contact layer; and
    an electrode embedded in the top contact layer, the electrode having a total surface area comprising a contacting surface area of Ac and a remaining surface area of Ar, wherein Ac>Ar, wherein the electrode has a non-conductive bottommost surface.

11. The LED structure of claim 10, wherein Ac>1.5Ar.

12. The LED structure of claim 10, wherein the top contact layer is a doped semiconductor layer.

13. The LED structure of claim 10, wherein the electrode comprises a metal, a metal alloy, a conductive material, or combinations thereof.

14. The LED structure of claim 10, wherein the entire electrode is below a top surface of the top contact layer.

15. The LED structure of claim 10, wherein the non-conductive bottommost surface is embedded deeper into the top contact layer than any other portion of the electrode.

16. An LED device comprising:
    a substrate comprising LED structure layers, including an active light-emitting layer, the LED structure layers having a top contact layer;
    an opening in the top contact layer defined by an upper surface of the top contact layer; and
    a first conductive layer, at least partially filling the opening in the top contact layer, thereby forming a top electrode, wherein the top electrode is in electrical contact with the top contact layer, wherein the top electrode has an upper surface that is below the upper surface of the top contact layer without physically contacting the top contact layer.

17. The LED device of claim 16, wherein the top electrode comprises a metal, a metal alloy, a conductive material, or combinations thereof.

18. The LED device of claim 16 further comprising a conductive web on the top contact layer, wherein the conductive web contacts the top contact layer.

19. The LED device of claim 18 wherein the conductive web and the top electrode are comprised of the same conductive material.

20. The LED device of claim 18, wherein the conductive web contacts the top contact layer and a plurality of top electrodes.

* * * * *